United States Patent
Kim et al.

(10) Patent No.: US 8,477,521 B2
(45) Date of Patent: Jul. 2, 2013

(54) FUSE CIRCUIT AND MEMORY DEVICE INCLUDING THE SAME

(75) Inventors: Kwi-Dong Kim, Gyeonggi-do (KR); Jun-Gi Choi, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 153 days.

(21) Appl. No.: 12/981,290

(22) Filed: Dec. 29, 2010

(65) Prior Publication Data

US 2012/0092947 A1 Apr. 19, 2012

(30) Foreign Application Priority Data

Oct. 15, 2010 (KR) .................. 10-2010-0100751

(51) Int. Cl.
- *G11C 17/00* (2006.01)
- *G11C 7/00* (2006.01)
- *G11C 17/18* (2006.01)
- *G11C 8/00* (2006.01)

(52) U.S. Cl.
USPC .......... 365/96; 365/200; 365/222; 365/225.7; 365/230.06; 365/236; 365/240

(58) Field of Classification Search
USPC ........... 365/96, 189.05, 200, 205, 225, 225.7, 365/226, 230.06, 236, 239, 240, 222, 249
See application file for complete search history.

(56) References Cited

U.S. PATENT DOCUMENTS

| | | | | |
|---|---|---|---|---|
| 5,402,390 | A * | 3/1995 | Ho et al. | 365/225.7 |
| 5,808,944 | A * | 9/1998 | Yoshitake et al. | 365/200 |
| 6,552,960 | B2 * | 4/2003 | Shirai et al. | 365/225.7 |
| 6,577,156 | B2 * | 6/2003 | Anand et al. | 365/225.7 |
| 6,762,969 | B2 * | 7/2004 | Sasaki et al. | 365/225.7 |
| 6,940,776 | B2 * | 9/2005 | Cho | 365/225.7 |
| 7,301,833 | B2 * | 11/2007 | Komura | 365/200 |
| 7,433,251 | B2 * | 10/2008 | Haraguchi et al. | 365/225.7 |
| 7,725,844 | B2 * | 5/2010 | Aipperspach et al. | 365/225.7 |
| 7,859,933 | B2 * | 12/2010 | Yoshida et al. | 365/225.7 |
| 7,978,493 | B1 * | 7/2011 | Tan et al. | 365/96 |
| 8,189,362 | B2 * | 5/2012 | Tan et al. | 365/96 |
| 8,213,211 | B2 * | 7/2012 | Kurjanowicz | 365/96 |

FOREIGN PATENT DOCUMENTS

| | | |
|---|---|---|
| KR | 1020060056687 | 5/2006 |
| KR | 1020060127014 | 12/2006 |
| KR | 1020080028441 | 3/2008 |
| KR | 1020080074611 | 8/2008 |

OTHER PUBLICATIONS

Notice of Allowance issued by the Korean Intellectual Property Office on Jan. 19, 2012.

* cited by examiner

*Primary Examiner* — Trong Phan
(74) *Attorney, Agent, or Firm* — IP & T Group LLP

(57) ABSTRACT

A fuse circuit includes a plurality of fuse cells, an amplification unit, and a plurality of registers. The amplification unit is configured to sequentially amplify data stored in the fuse cells. The registers are configured to sequentially store data amplified by the amplification unit.

15 Claims, 7 Drawing Sheets

FUSE CIRCUIT AND MEMORY DEVICE INCLUDING THE SAME

CROSS-REFERENCE TO RELATED APPLICATIONS

The present application claims priority of Korean Patent Application No. 10-2010-0100751, filed on Oct. 15, 2010, which is incorporated herein by reference in its entirety.

BACKGROUND OF THE INVENTION

Exemplary embodiments of the present invention relate to semiconductor devices, and more particularly, to a fuse circuit for storing data such as repair information in a semiconductor device.

In general, data of a fuse is classified according to whether a fuse is cut by a laser. Generally, a fuse is programmed in a wafer state, before the wafer is mounted in a package.

An antifuse is used to overcome such a limitation. The antifuse uses a transistor to store data. And data of an antifuse is classified according to the resistance between a gate and a drain/source.

FIG. 1 illustrates an antifuse including a transistor and an operation of the antifuse as a resistor or a capacitor.

Referring to FIG. 1, an antifuse includes a transistor T that has a gate G to which a power supply voltage is applied and a drain/source terminal D/S to which a ground voltage is applied.

When a normal power supply voltage, tolerable by the transistor T, is applied to the gate G, the antifuse operates as a capacitor C. Accordingly, no current flows between the gate G and the drain/source terminal D/S. However, when a high power supply voltage, intolerable by the transistor T, is applied to the gate G, the gate oxide of the transistor T is broken to short the gate G and the drain/source terminal D/S, and therefore, the antifuse operates as a resistor R. Accordingly, a current flows between the gate G and the drain/source terminal D/S.

Based on this fact, data of the antifuse are detected through the resistance value between the gate G and the drain/source terminal D/S. In one method, the data of the antifuse may be detected directly without a sensing operation by increasing the size of the transistor T. In another method, the data of the antifuse may be detected by sensing a current flowing through the transistor T by means of an amplifier, instead of increasing the size of the transistor T. However, the above two methods are disadvantageous in terms of area because the transistor T of the antifuse is designed to have a large size or an amplifier for each antifuse must be included.

SUMMARY OF THE INVENTION

Exemplary embodiments of the present invention are directed to reduce the area of a fuse circuit including a plurality of fuses.

In accordance with an exemplary embodiment of the present invention, a fuse circuit includes a plurality of fuse cells, an amplification unit configured to sequentially amplify data stored in the fuse cells, and a plurality of registers configured to sequentially store data amplified by the amplification unit.

The fuse cell may be an antifuse cell, and the sequential amplification operation of the amplification unit and the sequential storage operation of the registers may be performed in an initial operation of a system including the fuse circuit.

In accordance with another exemplary embodiment of the present invention, a fuse circuit includes a plurality of fuse cells configured to be enabled in response to a selection signal corresponding thereto among a plurality of selection signals, a counter unit configured to count an oscillation wave and generate an address, a decoder unit configured to decode the address and generate the selection signals, an amplification unit configured to amplify data of the enabled fuse cell among the fuse cells, and a plurality of registers configured to be enabled in response to a selection signal corresponding thereto among the selection signals, and store data amplified by the amplification unit.

In accordance with yet another exemplary embodiment of the present invention, a memory device includes a plurality of fuse cells configured to be enabled in response to a selection signal corresponding thereto among a plurality of selection signals, a counter unit configured to count an oscillation wave and generate an address, a decoder unit configured to decode the address and generate the selection signals, an amplification unit configured to amplify data of the enabled fuse cell among the fuse cells, a bank region including a plurality of memory cells and a plurality of registers, each of the registers configured to be enabled in response to a selection signal corresponding thereto among the selection signals and to store data amplified by the amplification unit, and a plurality of address lines configured to transmit the address to the bank region.

DESCRIPTION OF SPECIFIC EMBODIMENTS

Figure 1:
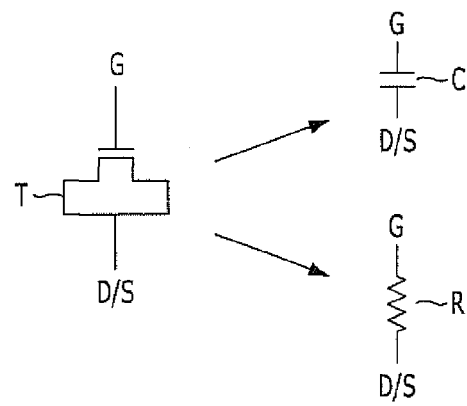
FIG. 1 is a diagram illustrating an antifuse including a transistor and an operation of the antifuse as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
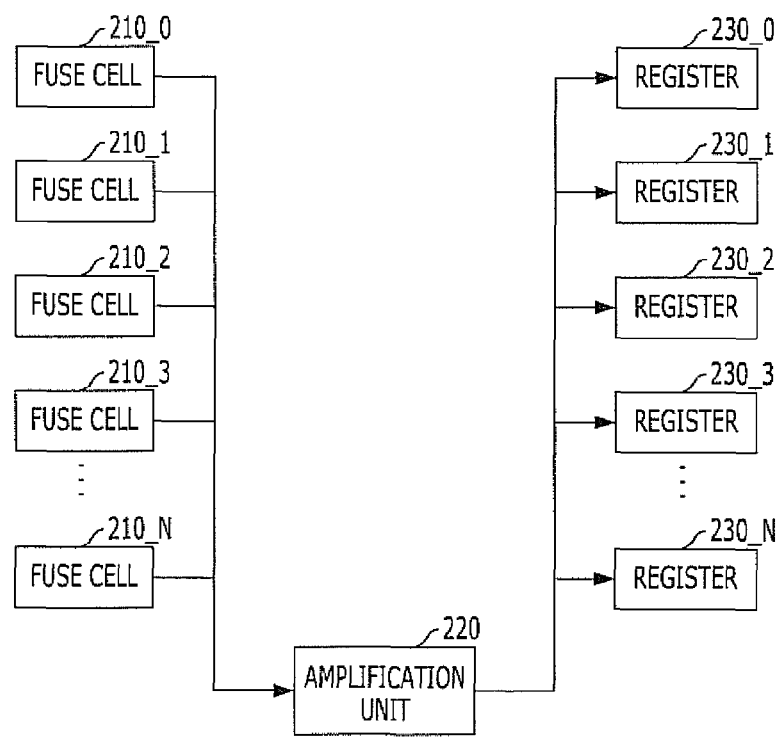
FIG. 2 is a block diagram of a fuse circuit in accordance with an exemplary embodiment of the present invention.

FIG. 2 is a block diagram of a fuse circuit in accordance with an exemplary embodiment of the present invention.

Referring to FIG. 2, a fuse circuit in accordance with an exemplary embodiment of the present invention includes a plurality of fuse cells 210_0 to 210_N, an amplification unit 220, and a plurality of registers 230_0 to 230_N. The amplification unit 220 is configured to sequentially amplify data stored in the fuse cells 210_0 to 210_N. The registers 230_0 to 230_N are configured to sequentially store data amplified by the amplification unit 220.

Each of the fuse cells 210_0 to 210_N stores data according to a program result. The fuse cells 210_0 to 210_N may be antifuse cells that require an amplification operation for sensing data. However, because typical fuses (e.g., laser-cut fuses) may also require an amplification operation, the fuse cells 210_0 to 210_N may be types of fuses other than antifuses.

The amplification unit 220 sequentially amplifies data stored in the fuse cells 210_0 to 210_N. The term 'sequential' means that the data of the fuse cells 210_0 to 210_N are amplified one by one in a predetermined order, but does not necessarily mean that the data of the fuse cells 210_0 to 210_N are amplified in order from the $0^{th}$ fuse cell 210_0 to the $N^{th}$ fuse cell 210_N. That is, the order of amplification of the data of the fuse cells 210_0 to 210_N by the amplification unit 220 may vary according to different embodiments. In an exemplary embodiment of the present invention, the amplification unit 220 performs a sequential amplification operation. Therefore, there is no need to provide the amplification unit 220 for each of the fuse cells 210_0 to 210_N. Thus, one amplification unit 220 may be provided for the fuse cells 210_0 to 210_N. For example, one amplification unit may be provided for every 100 fuse cells. Also, a total of 200 fuse cells may be provided, and two amplification units may be provided for the 200 fuse cells to sequentially amplify data of the corresponding fuse cells.

The registers 230_0 to 230_N sequentially store data amplified by the amplification unit 220. The registers 230_0 to 230_N correspond one-to-one to the fuse cells 210_0 to 210_N, and each of the registers 230_0 to 230_N stores data of the corresponding fuse cell 210_0 to 210_N. For example, data of the $0^{th}$ fuse cell 210_0 are amplified by the amplification unit 220 and the resulting data are stored in the $0^{th}$ register 230_0, and data of the fourth fuse cell 210_4 are amplified by the amplification unit 220 and the resulting data are stored in the fourth register 230_4. The registers 230_0 to 230_N may include a latch. The registers 230_0 to 230_N have a high data input/output speed. Therefore, a system (e.g., various semiconductor chips such as memory devices) using the fuse circuit can rapidly access data stored in the registers 230_0 to 230_N to obtain desirable information for the system.

The fuse circuit of the present invention sequentially amplifies the data stored in the fuse cells 210_0 to 210_N, stores the resulting data in the registers 230_0 to 230_N, and provides the data stored in the registers 230_0 to 230_N to a system using the fuse circuit. The amplification unit 220 performs a sequential amplification operation. Therefore, it is not necessary to provide an amplifier, such as the amplification unit 220, for each of the fuse cells 210_0 to 210_N, thus making it possible to greatly reduce the total area of the fuse circuit.

The data stored in the fuse cells 210_0 to 210_N must be amplified prior to storage in the registers 230_0 to 230_N so that the system using the fuse circuit can use the data stored in the fuse cells 210_0 to 210_N. Thus, an amplification operation of the amplification unit 220 and an operation of storing the data amplified by the amplification unit 220 in the registers 230_0 to 230_N may be performed in an initial operation of the system using the fuse circuit.

Figure 3:
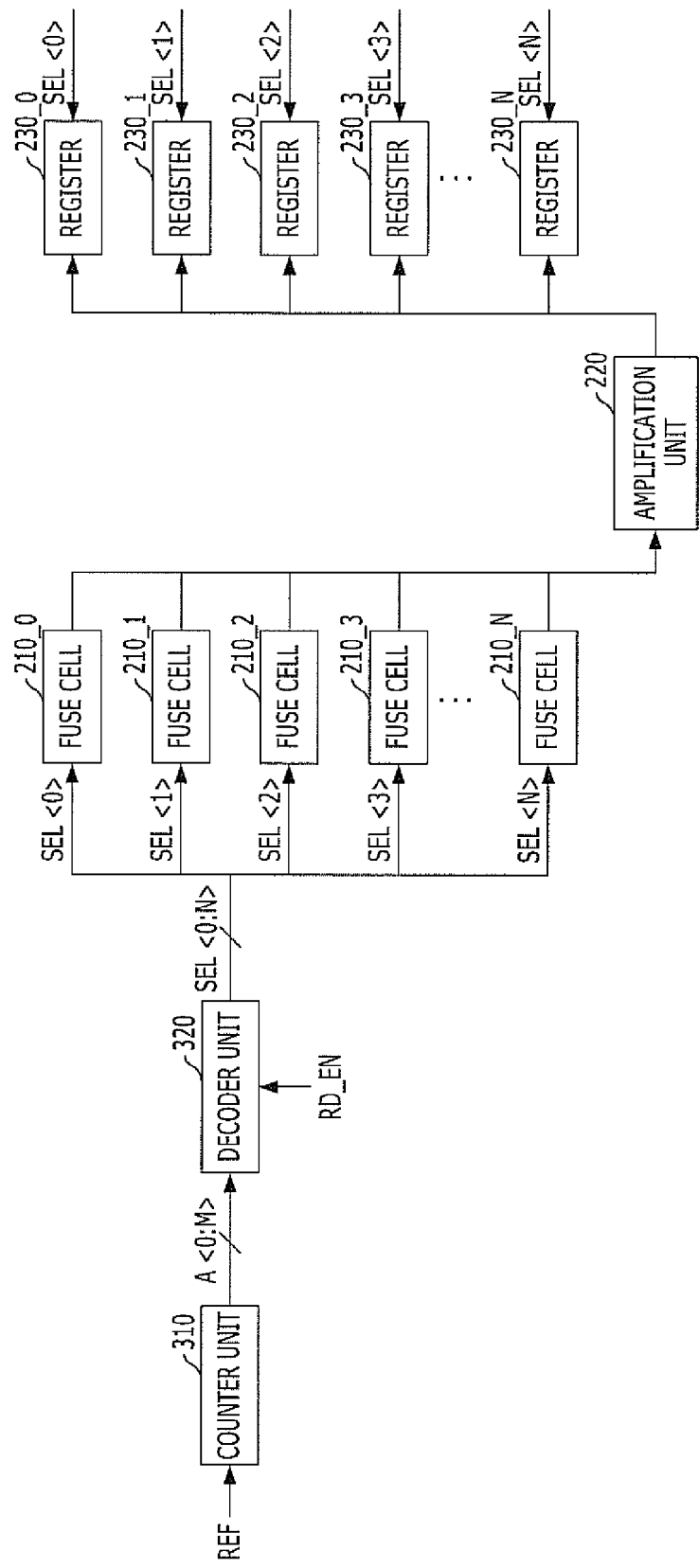
FIG. 3 is a block diagram of the fuse circuit of FIG. 2 in accordance with an exemplary embodiment of the present invention.

FIG. 3 is a block diagram of the fuse circuit of FIG. 2 in accordance with an exemplary embodiment of the present invention.

FIG. 3 illustrates an exemplary case where a fuse circuit of the present invention is applied to a memory device and a portion of the configuration of the fuse circuit is shared with the original configuration of the memory device.

Referring to FIG. 3, a fuse circuit in accordance with an exemplary embodiment of the present invention includes a plurality of fuse cells 210_0 to 210_N, a counter unit 310, a decoder unit 320, an amplification unit 220, and a plurality of registers 230_0 to 230_N.

The counter unit 310 is configured to count an auto refresh signal REF and generate an address A<0:M>. An auto refresh operation is performed in an initial operation mode of the memory device. To this end, in the initial operation mode of the memory device, an auto refresh command is periodically applied to periodically activate the auto refresh signal REF. The counter unit 310 counts the auto refresh signal REF and increases the value of the address A<0:M> whenever the auto refresh signal REF is activated.

Whenever the auto refresh signal REF is activated, an auto refresh operation of the memory device is performed to sequentially activate word lines of different addresses. Thus, the memory device includes a counter unit configured to count the auto refresh signal REF and increase the address A<0:M>. Thus, the counter unit provided in the memory device for an auto refresh operation may be used as the counter unit 310 of the present invention.

The decoder unit 320 is configured to decode the address A<0:M> and generate a plurality of selection signals SEL<0:N>. One of the selection signals SEL<0:N> is activated according to the decoding results of the address A<0:M> by the decoder unit 320. Because the value of the address A<0:M> is continuously increased by the counter unit 310, the selection signal SEL<0:N> activated by the decoder unit 320 is continuously changed. For example, according to the decoding results of the decoder unit 320, the selection signal SEL<0> is first activated and then the selection signals SEL<1>, SEL<2>, ... SEL<N> are sequentially activated. An enable signal RD_EN is inputted to the decoder unit 320 to enable the decoder unit 320. When the enable signal RD_EN is activated, the decoder unit 320 performs a normal decoding operation; and when the enable signal RD_EN is deactivated, the decoder unit 320 deactivates all the selection signals SEL<0:N>.

The fuse cells 210_0 to 210_N are configured to be enabled in response to the selection signal corresponding thereto among the selection signals SEL<0:N>. For example, the fuse cell 210_0 may be enabled in response to the selection signal SEL<0>, and the fuse cell 210_4 may be enabled in response to the selection signal SEL<4>. When one of the selection signals SEL<0:N> is activated, the corresponding fuse cell among the fuse cells 210_0 to 210_N outputs the data stored therein to the amplification unit 220. For example, when the selection signal SEL<1> is activated, data of the fuse cell 210_1 are transmitted to the amplification unit 220; and when the selection signal SEL<N> is activated, data of the fuse cell 210_N are transmitted to the amplification unit 220. As described above, the fuse cells 210_0 to 210_N may be antifuse cells that require an amplification operation for sensing data.

The amplification unit 220 is configured to amplify data outputted from the enabled fuse cell among the fuse cells 210_0 to 210_N. As described above, the fuse cells 210_0 to 210_N are sequentially enabled one by one according to the selection signals SEL<0:N>, and the amplification unit 220 amplifies data of the enabled fuse cell.

The registers 230_0 to 230_N are configured to be enabled in response to the selection signal corresponding thereto among the selection signals SEL<0:N>. For example, the register 230_0 may be enabled in response to the selection signal SEL<0>, and the register 230_4 may be enabled in response to the selection signal SEL<4>. When one of the selection signals SEL<0:N> is activated, the corresponding register among the registers 230_0 to 230_N stores the data amplified by the amplification unit 220. For example, when the selection signal SEL<1> is activated, the data amplified by the amplification unit 220 are stored in the register 230_1; and when the selection signal SEL<N> is activated, the data amplified by the amplification unit 220 are stored in the register 230_N.

Accordingly, in the initial auto refresh operation period of the memory device, the fuse circuit sequentially amplifies the data stored in the fuse cells 210_0 to 210_N and stores the resulting data in the registers 230_0 to 230_N. Thereafter, the fuse circuit enables the memory device to directly use the data (e.g., repair information) stored in the registers 230_0 to 230_N.

Figure 4:
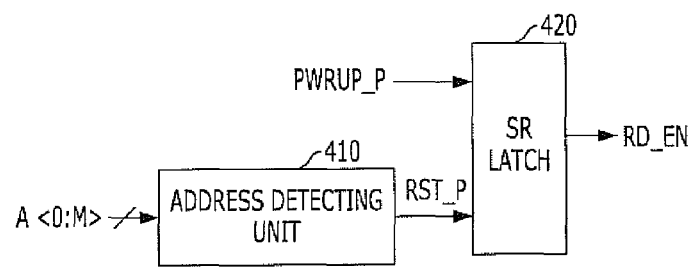
FIG. 4 is a block diagram of a circuit for generating an enable signal RD_EN of FIG. 3.

FIG. 4 is a block diagram of a circuit for generating the enable signal RD_EN of FIG. 3.

The fuse circuit stores all the data, stored in the fuse cells 210_0 to 210_N during the initial operation of the memory device, in the registers 230_0 to 230_N. However, after the data stored in the fuse cells 210_0 to 210_N are stored in the registers 230_0 to 230_N, there is no need to again transmit the data. Therefore, the enable signal RD_EN is activated only for a time period taken to transmit the data of the fuse cells 210_0 to 210_N to the registers 230_0 to 230_N, thereby preventing the data of the fuse cells 210_0 to 210_N from being repeatedly transmitted after transmission to the registers 230_0 to 230_N.

The circuit for generating the enable signal RD_EN includes an address detecting unit 410 and an SR latch 420.

The address detecting unit 410 is configured to activate its output signal RST_P when the address A<0:M> reaches a certain value. Herein, the certain value corresponds to the number of fuse cells 210_0 to 210_N and the number of registers 230_0 to 230_N. For example, if the fuse circuit includes one-hundred (100) fuse cells 210_0 to 210_N and one-hundred (100) registers 230_0 to 230_N, the certain value is one-hundred (100); and if the fuse circuit includes two-hundred (200) fuse cells 210_0 to 210_N and two-hundred (200) registers 230_0 to 230_N, the certain value is two-hundred (200).

The SR latch 420 is configured to activate the enable signal RD_EN in response to a power-up pulse signal PWRUP_P and deactivate the enable signal RD_EN in response to the output signal RST_P of the address detecting unit 410. Herein, the power-up pulse signal PWRUP_P is activated after the power-up of the memory device.

Figure 5:
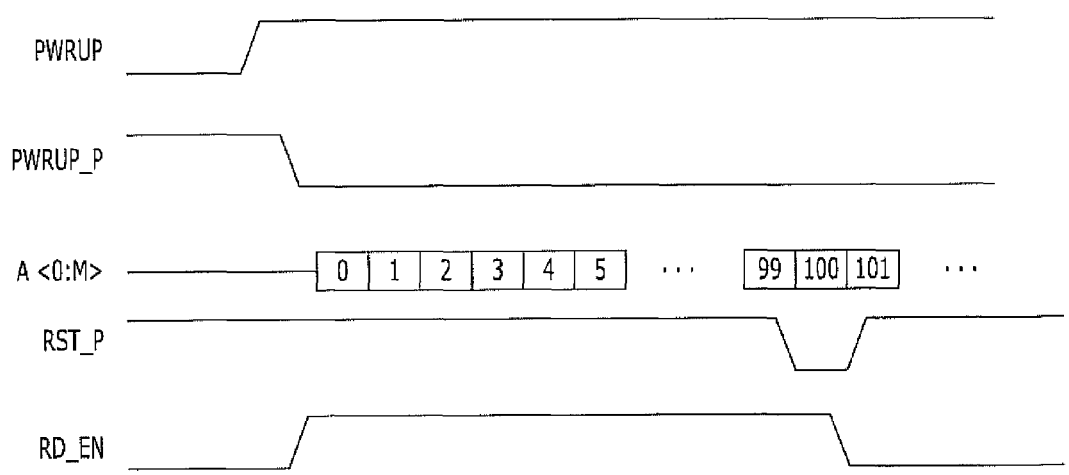
FIG. 5 is a timing diagram illustrating an operation of the circuit of FIG. 4.

FIG. 5 is a timing diagram illustrating an operation of the circuit of FIG. 4.

Referring to FIG. 5, when a power-up operation of the memory device is completed, a power-up signal PWRUP changes from a logic high level to a logic low level and the power-up pulse signal PWRUP_P is activated to a logic low level. In response to the activation of the power-up pulse signal PWRUP_P, the SR latch 420 activates the enable signal RD_EN to a logic high level.

Meanwhile, the counter unit 310 gradually increases the value of the address A<0:M> from 0. When the value of the address A<0:M> reaches a certain value (e.g., 100), the address detecting unit 410 activates the output signal RST_P to a logic low level. In response to the logic-low activated output signal RST_P, the enable signal RD_EN is deactivated to a logic low level.

During the activation period of the enable signal RD_EN, the data stored in the fuse cells 210_0 to 210_N are sequentially amplified by the amplification unit 220 and transmitted to the registers 230_0 to 230_N. However, once the enable signal RD_EN is deactivated, which is preferably after all the data stored in the fuse cells 210_0 to 210_N are transmitted to the registers 230_0 to 230_N, the amplification and data transmission operations are not performed.

Figure 6:
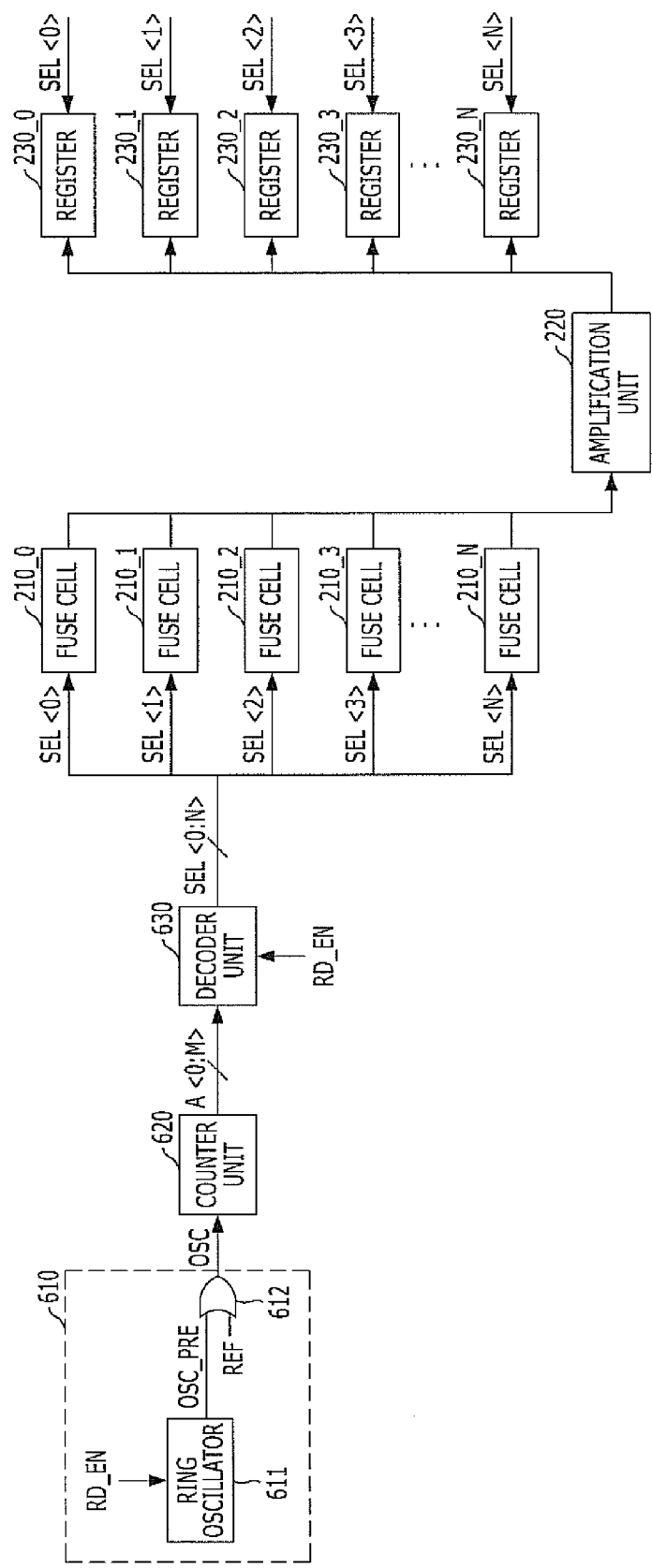
FIG. 6 is a block diagram of the fuse circuit of FIG. 2 in accordance with another exemplary embodiment of the present invention.

FIG. 6 is a block diagram of the fuse circuit of FIG. 2 in accordance with another exemplary embodiment of the present invention.

FIG. 3 illustrates an exemplary case where data are transmitted from the fuse cells 210_0 to 210_N to the registers 230_0 to 230_N of the fuse circuit in the auto refresh operation period after the power-up of the memory device. However, there may be a memory device that does not perform an auto refresh operation during the initialization period. Thus, FIG. 6 illustrates an exemplary case where data are transmitted from the fuse cells 210_0 to 210_N to the registers 230_0 to 230_N in a wait time period initiated by a reset signal that is first activated after an operation of the memory device.

Referring to FIG. 6, a fuse circuit in accordance with another exemplary embodiment of the present invention includes a plurality of fuse cells 210_0 to 210_N, an oscillation wave generating unit 610, a counter unit 620, a decoder unit 630, an amplification unit 220, and a plurality of registers 230_0 to 230_N.

The oscillation wave generating unit 610 may include a ring oscillator 611 and an output unit 612. The ring oscillator 611 is configured to generate a preliminary oscillation wave OSC_PRE. The output unit 612 is configured to output the preliminary oscillation wave OSC_PRE or the auto refresh signal REF as an oscillation wave OSC. As shown in FIG. 6, the output unit 612 may be configured with an OR gate. The ring oscillator 611 periodically activates the preliminary oscillation wave OSC_PRE during the activation period of the enable signal RD_EN, and fixes the preliminary oscillation wave OSC_PRE to a logic low level during the deactivation period of the enable signal RD_EN. When the preliminary oscillation wave OSC_PRE toggles, the output unit 612 outputs it as the oscillation wave OSC; and when the auto refresh signal REF toggles, the output unit 612 outputs it as the oscillation wave OSC. The fuse circuit in accordance with the exemplary embodiment of FIG. 6 utilizes the ring oscillator 611 to transmit the data of the fuse cells 210_0 to 210_N to the registers 230_0 to 230_N in a non auto refresh period (i.e., the period when the auto refresh signal REF is not periodically activated).

The counter unit 620 is configured to count an oscillation wave OSC and generate an address A<0:M>. Whenever the oscillation wave OSC is activated by the operation of the counter unit 620, the value of the address A<0:M> increases. As in the exemplary embodiment of FIG. 3, the counter provided for an auto refresh operation in the memory device may be used as the counter unit 620 of the present invention.

The decoder unit 630 is configured to decode the address A<0:M> and generate a plurality of selection signals SEL<0:

N>. One of the selection signals SEL<0:N> is activated according to the decoding results of the address A<0:M> by the decoder unit 630. Because the value of the address A<0:M> is continuously increased by the counter unit 620, the selection signal SEL<0:N> activated by the decoder unit 630 is continuously changed. For example, according to the decoding results of the decoder unit 630, the selection signal SEL<0> is first activated and then the selection signals SEL<1>, SEL<2>, . . . SEL<N> are sequentially activated. An enable signal RD_EN is inputted to the decoder unit 630 to enable the decoder unit 630. When the enable signal RD_EN is activated, the decoder unit 630 performs a normal decoding operation; and when the enable signal RD_EN is deactivated, the decoder unit 630 deactivates all the selection signals SEL<0:N>.

The fuse cells 210_0 to 210_N are configured to be enabled in response to the selection signal corresponding thereto among the selection signals SEL<0:N>. For example, the fuse cell 210_0 may be enabled in response to the selection signal SEL<0>, and the fuse cell 210_4 may be enabled in response to the selection signal SEL<4>. When one of the selection signals SEL<0:N> is activated, the corresponding fuse cell among the fuse cells 210_0 to 210_N outputs the data stored therein to the amplification unit 220. For example, when the selection signal SEL<1> is activated, data of the fuse cell 210_1 are transmitted to the amplification unit 220; and when the selection signal SEL<N> is activated, data of the fuse cell 210_N are transmitted to the amplification unit 220. As described above, the fuse cells 210_0 to 210_N may be antifuse cells that require an amplification operation for sensing data.

The amplification unit 220 is configured to amplify data outputted from the enabled fuse cell among the fuse cells 210_0 to 210_N. As described above, the fuse cells 210_0 to 210_N are sequentially enabled one by one according to the selection signals SEL<0:N>, and the amplification unit 220 amplifies data of the enabled fuse cell.

The registers 230_0 to 230_N are configured to be enabled in response to the selection signal corresponding thereto among the selection signals SEL<0:N>. For example, the register 230_0 may be enabled in response to the selection signal SEL<0>, and the register 230_4 may be enabled in response to the selection signal SEL<4>. When one of the selection signals SEL<0:N> is activated, the corresponding register among the registers 230_0 to 230_N stores the data amplified by the amplification unit 220. For example, when the selection signal SEL<1> is activated, the data amplified by the amplification unit 220 are stored in the register 230_1; and when the selection signal SEL<N> is activated, the data amplified by the amplification unit 220 are stored in the register 230_N.

Accordingly, in the deactivation period of the enable signal RD_EN, the fuse circuit sequentially amplifies the data stored in the fuse cells 210_0 to 210_N and stores the resulting data in the registers 230_0 to 230_N. Thereafter, the fuse circuit enables the memory device to directly use the data (e.g., repair information) stored in the registers 230_0 to 230_N.

Figure 7:
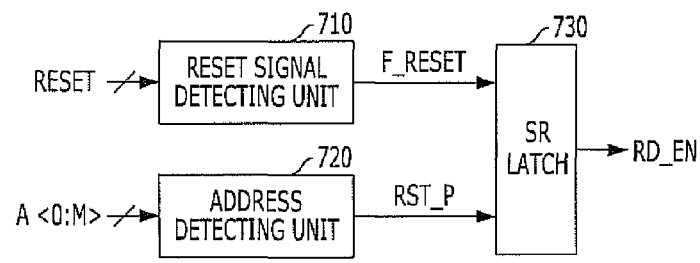
FIG. 7 is a block diagram of a circuit for generating an enable signal of FIG. 6.

FIG. 7 is a block diagram of a circuit for generating the enable signal RD_EN of FIG. 6.

The fuse circuit of FIG. 6 transmits all the data stored in the fuse cells to the registers during a wait time period (generally, 500 ps after the first reset) initiated by the reset signal that is first activated after the operation of the memory device. The circuit of FIG. 7 is configured to activate the enable signal in the wait time period.

The circuit for generating the enable signal RD_EN includes a reset signal detecting unit 710, an address detecting unit 720, and an SR latch 730.

The reset signal detecting unit 710 is configured to receive a reset signal RESET and activate a reset detection signal F_RESET only when the reset signal RESET is first activated. For example, if the reset signal RESET is activated three times after the operation of the memory device, the reset detection signal F_RESET is activated only when the reset signal RESET is first activated.

The address detecting unit 720 is configured to activate its output signal RST_P when the address A<0:M> reaches a certain value. Herein, the certain value corresponds to the number of fuse cells 210_0 to 210_N and the number of registers 230_0 to 230_N. For example, if the fuse circuit includes one-hundred (100) fuse cells 210_0 to 210_N and one-hundred (100) registers 230_0 to 230_N, the certain value is one-hundred (100); and if the fuse circuit includes two-hundred (200) fuse cells 210_0 to 210_N and two-hundred (200) registers 230_0 to 230_N, the certain value is two-hundred (200).

When the reset detection signal F_RESET is activated, the SR latch 730 activates the enable signal RD_EN; and when the output signal RST_P is activated, the SR latch 730 deactivates the enable signal RD_EN.

Consequently, when first reset signal RST_P is activated, the enable signal RD_EN is activated, and when all the data of the fuse cells 210_0 to 210_N are transmitted to the registers 230_0 to 230_N, the enable signal RD_EN is deactivated.

Figure 8:
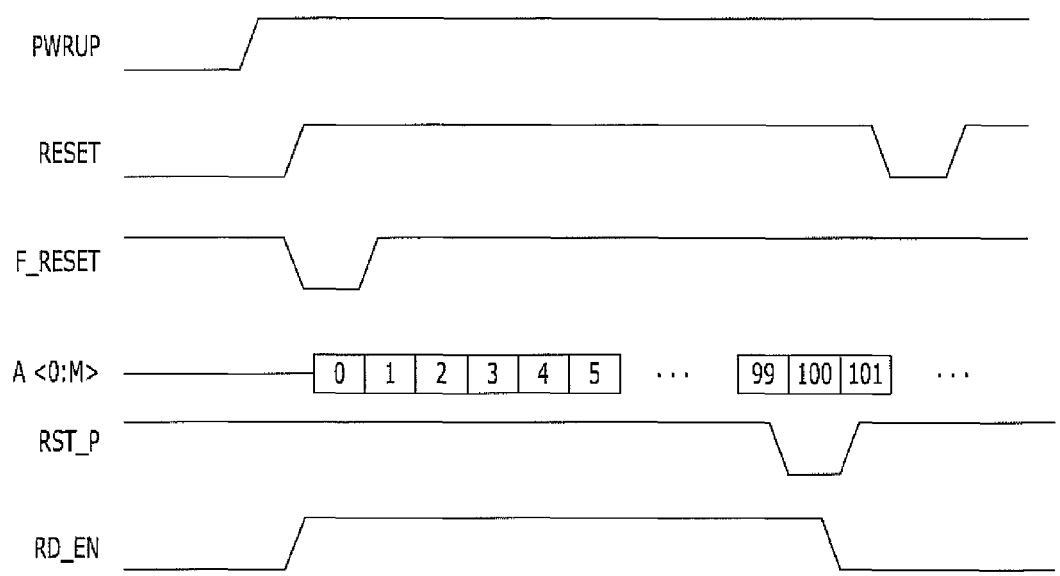
FIG. 8 is a timing diagram illustrating an operation of the circuit of FIG. 7.

FIG. 8 is a timing diagram illustrating an operation of the circuit of FIG. 7.

Referring to FIG. 8, when a power-up operation of the memory device is completed, the power-up signal PWRUP is activated to a logic high level and then the reset signal RESET is activated to a logic high level. When the reset signal RESET is first activated, the reset signal detecting unit 710 activates the reset detection signal F_RESET to a logic low level. In response to the logic-low activated reset detection signal F_RESET, the SR latch 730 activates the enable signal RD_EN to a logic high level.

Meanwhile, the counter unit 620 gradually increases the value of the address A<0:M> from 0. When the value of the address A<0:M> reaches a certain value (e.g., 100), the address detecting unit 720 activates the output signal RST_P to a logic low level. In response to the logic-low activated output signal RST_P, the SR latch 730 deactivates the enable signal RD_EN to a logic low level.

Figure 9:
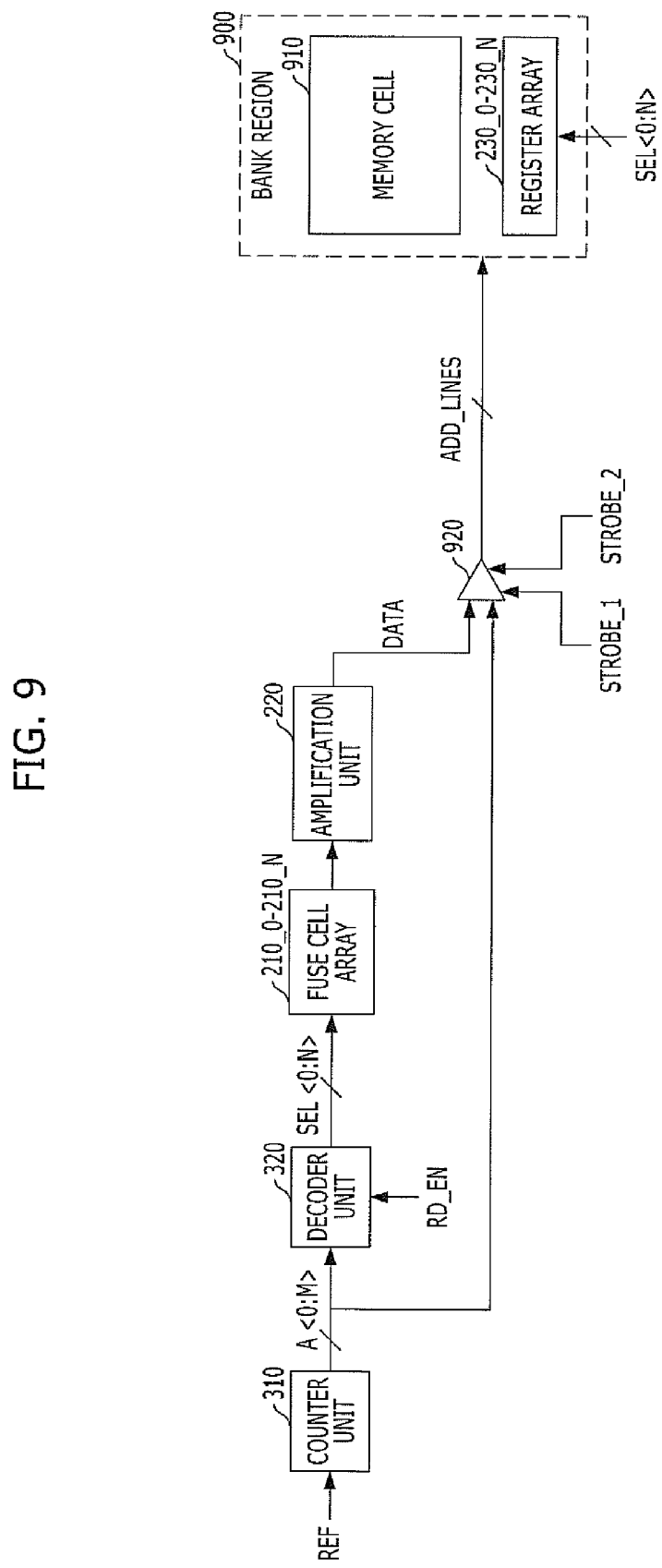
FIG. 9 is a block diagram of a memory device including the fuse circuit of FIG. 3 in accordance with an exemplary embodiment of the present invention.

FIG. 9 is a block diagram of a memory device including the fuse circuit of FIG. 3 in accordance with an exemplary embodiment of the present invention.

Referring to FIG. 9, a memory device in accordance with an exemplary embodiment of the present invention includes a plurality of fuse cells 210_0 to 210_N, a counter unit 310, a decoder unit 320, an amplification unit 220, a bank region 900, and a plurality of address lines ADD_LINES. The fuse cells 210_0 to 210_N are configured to be enabled in response to a selection signal corresponding thereto among a plurality of selection signals SEL<0:N>. The counter unit 310 is configured to count an auto refresh signal REF and generate an address A<0:M>. The decoder unit 320 is configured to decode the address A<0:M> and generate the selection signals SEL<0:N>. The amplification unit 220 is configured to amplify data of the enabled fuse cell among the fuse cells 210_0 to 210_N. The bank region 900 includes a plurality of memory cells 910 and a plurality of registers 230_0 to 230_N configured to be enabled in response to a selection signal corresponding thereto among the selection signals SEL<0:

N>, and store data amplified by the amplification unit 220. The address lines ADD_LINES are configured to transmit the address A<0:M> to the bank region 900. Herein, at least one of the address lines ADD_LINES transmits not only the address A<0:M> but also the data amplified by the amplification unit 220.

In an auto refresh operation, the fuse circuit amplifies the data stored in the fuse cells 210_0 to 210_N and transmits the resulting data to the registers 230_0 to 230_N included in the bank region 900. Also, in the auto refresh operation, the address A<0:M> generated by the counter 310 must be transmitted from the counter 310 to the bank region 900. Thus, the memory device includes the address lines ADD_LINES to transmit the address A<0:M> to the bank region 900. The fuse circuit of the present invention uses at least one of the address lines ADD_LINES to transmit the data DATA amplified by the amplification unit 220 to the registers 230_0 to 230_N included in the bank region 900.

That is, the address A<0:M> generated by the counter unit 310 and the data DATA amplified by the amplification unit 220 are simultaneously transmitted through at least one of the address lines ADD_LINES. This may be implemented by using a time-division scheme that transmits the address (A<X>, where X is any integer from 0 to M) through at least one of the address lines ADD_LINES during a first time period and transmits the data DATA through at least one of the address lines ADD_LINES during a second time period.

A driver 920 transmits the address A<0:M> through one of the address lines ADD_LINES to the bank region 900 at the activation time of a first signal STROBE_1, and transmits the data DATA through the same address line to the bank region 900 at the activation time of a second signal STROBE_2. Herein, the first signal STROBE_1 is generated by using the refresh signal REF, and the second signal STROBE_2 is generated by delaying the first signal STROBE_1.

According to the time division scheme, conventional address lines may be used as the address lines ADD_LINES used to transmit the data stored in the fuse cells 210_0 to 210_N to the registers 230_0 to 230_N, thus preventing an increase in the area of the memory device using the fuse circuit of the present invention.

Although FIG. 9 illustrates that the memory device includes only one bank region, the present invention is not limited thereto. In other exemplary embodiments the memory device may include 8 or 16 banks. Because the data stored in the fuse cells must be transmitted to the corresponding registers included in the bank region, the time division scheme can prevent an increase in the area of the memory device.

Figure 10:
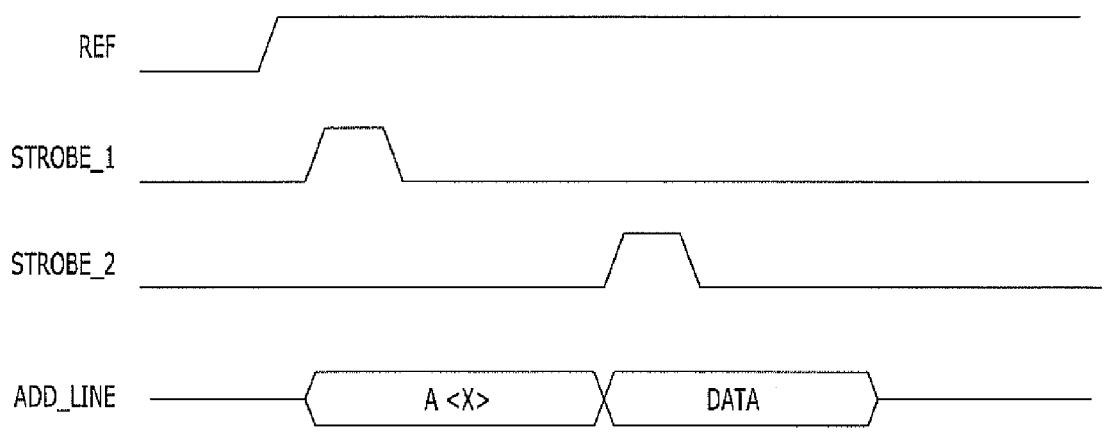
FIG. 10 is a timing diagram of one of the address lines of FIG. 9 that transmits an address and data in a time division manner.

FIG. 10 is a timing diagram of one of the address lines ADD_LINE of FIG. 9 that transmits the address A<X> and the data DATA in a time division manner.

Referring to FIG. 10, the first signal STROBE_1 is activated to a logic high level at the time when the auto refresh signal REF is activated to a logic high level. Then, the driver 920 loads the address A<X> on the address line ADD_LINE. The second signal STROBE 2 is activated after a certain time from the activation time point of the first signal STROBE_1. The driver 920 loads the data DATA on the address line ADD_LINE in response to the second signal STROBE_2. That is, the address A<X> and the data (DATA) are transmitted through the address line ADD_LINE in a time division manner.

For reference, when the address A<X> is transmitted through the address line ADD_LINE to the bank region 900, a row decoder (not illustrated) provided in the bank region 900 for selection of a word line latches the address A<X>. After the address A<X> is latched by the row decoder, even if the data DATA are loaded on the address line ADD_LINE, it does not affect the operation of the row decoder.

As described above, in accordance with the exemplary embodiments of the present invention, the data of fuse cells are sequentially amplified by an amplification unit, and the amplified data are sequentially stored in registers. Thus, even if the fuses are designed to have a small size, there is no need to provide an amplifier for each fuse, thereby making it possible to reduce the area of the fuse circuit.

Also, if the fuse circuit is used in a memory device, conventional elements of the memory device can be shared, thereby making it possible to reduce the area of the memory device.

While the present invention has been described with respect to the specific embodiments, it will be apparent to those skilled in the art that various changes and modifications may be made without departing from the spirit and scope of the invention as defined in the following claims.

What is claimed is:

1. A fuse circuit comprising:
a plurality of fuse cells to be enabled in response to a corresponding selection signal of a plurality of selection signals;
a counter unit to count an oscillation wave and generate an address;
a decoder unit to decode the address and generate the plurality of selection signals;
an amplification unit to amplify data of an enabled fuse cell of the plurality of cells; and
a plurality of registers to be enabled in response to the corresponding selection signal, and to store data amplified by the amplification unit.

2. The fuse circuit of claim 1, wherein at least one of the plurality of fuse cells is an antifuse cell.

3. The fuse circuit of claim 1, wherein the decoder unit is enabled in response to an enable signal that is activated in an initial operation of a system including the fuse circuit.

4. The fuse circuit of claim 1, wherein
the fuse circuit is used in a memory device,
the oscillation wave is an auto refresh signal applied to the memory device, and
the decoder unit is enabled in response to an enable signal that is activated in an initial operation of the memory device.

5. The fuse circuit of claim 4, wherein the address generated by the counter unit is used in an auto refresh operation of the memory device.

6. The fuse circuit of claim 4, wherein the enable signal is activated in response to a power-up signal, and is deactivated after all of the plurality of fuse cells are sequentially enabled.

7. The fuse circuit of claim 4, wherein an output signal is to be generated, by an address detecting unit, based on a detected value of the address, and where the enable signal is to be deactivated, by an SR latch, in response to the output signal.

8. The fuse circuit of claim 1, further comprising an oscillation wave generating unit to generate the oscillation wave.

9. The fuse circuit of claim 8, wherein
the oscillation wave generating unit comprises:
a ring oscillator to generate a preliminary oscillation wave; and
an output unit to output the preliminary oscillation wave or an auto refresh signal as the oscillation wave.

10. The fuse circuit of claim 9, wherein the decoder unit is enabled in response to an enable signal that is activated within a wait time period initiated by a first activation of a reset signal after an operation of the memory device.

11. The fuse circuit of claim 9, wherein the decoder unit is enabled in response to an enable signal that is activated at a first activation of a reset signal after an operation of the memory device, and is deactivated after all of the plurality of the fuse cells are sequentially enabled.

12. A memory device comprising:
- a plurality of fuse cells configured to be enabled in response to a corresponding selection signal of a plurality of selection signals;
- a counter unit to count an oscillation wave and generate an address;
- a decoder unit to decode the address and generate the plurality of selection signals;
- an amplification unit to amplify data of an enabled fuse cell of the plurality of fuse cells;
- a bank region including a plurality of memory cells and a plurality of registers, each of the plurality of registers to be enabled in response to the corresponding selection signal, of the plurality of selection signals, and to store the data amplified by the amplification unit; and
- a plurality of address lines to transmit the address to the bank region.

13. The memory device of claim 12, wherein at least one of the plurality of address lines transmits the address during a first time period and transmits the amplified data during a second time period.

14. The memory device of claim 12, wherein at least one address line, of the plurality of address lines, is to transmit the address in response to a first signal generated by the auto refresh signal and is to transmit the amplified data in response to a second signal generated by delaying the first signal.

15. The memory device of claim 12, further comprising:
- a driver to load the address on at least one address line, of the address lines, and load the amplified data on the at least one address line of the plurality of address lines.

* * * * *